United States Patent [19]
Blanton

[11] Patent Number: 4,827,437
[45] Date of Patent: May 2, 1989

[54] AUTO CALIBRATION CIRCUIT FOR VLSI TESTER

[75] Inventor: LeRoy Blanton, Dallas, Tex.

[73] Assignee: VHL Associates, Inc., Richardson, Tex.

[21] Appl. No.: 910,088

[22] Filed: Sep. 22, 1986

[51] Int. Cl.[4] .................. G01R 31/28; G06F 11/30
[52] U.S. Cl. .................. 364/571.01; 364/579; 364/571.05; 371/22
[58] Field of Search .......... 364/571, 579, 580, 571.01, 364/571.05; 371/20, 22, 24, 25

[56] References Cited

U.S. PATENT DOCUMENTS

| | | | |
|---|---|---|---|
| 3,889,109 | 6/1975 | Blessin | 371/24 |
| 4,290,137 | 9/1981 | Hilker | 371/24 |
| 4,523,312 | 6/1985 | Takeuchi | 371/25 X |
| 4,584,683 | 4/1986 | Shimizu | 371/25 |
| 4,641,306 | 2/1987 | Annecke et al. | 371/25 |
| 4,646,299 | 2/1987 | Schinabeck et al. | 371/20 |

Primary Examiner—Felix D. Gruber
Attorney, Agent, or Firm—Ross, Howison, Clapp & Korn

[57] ABSTRACT

A calibration system for automatic test equipment for testing electronic circuits includes a cable (68) of a predetermined length connected to a common node (74). A switch (66) connects the input of the cable to a test terminal (56) and (48). Each of the test terminals in the system is connected through a similar cable to the common node (74). A transmitter (46) and a receiver (48) are disposed at each terminal in the system and are activated at a single time to provide a incident clock edge into the terminal and to receive a reflected clock edge from the common node (74). By measuring the delay between incident and reflected clock edges for all of the terminals and comparing it with the expected delay, a relative error can be generated and a correction made. Another iteration can be repeated if necessary and a correction effected until the system is calibrated.

18 Claims, 5 Drawing Sheets

AUTO CALIBRATION CIRCUIT FOR VLSI TESTER

TECHNICAL FIELD OF THE INVENTION

The present invention pertains in general to logic testers, and more particularly, to an auto calibration circuit for use in calibrating a tester that is utilized on testing of large and small scale integrated circuits.

BACKGROUND OF THE INVENTION

As the complexity of VLSI devices increases, the complexity of testing these devices in a production environment also increases. Testers have evolved which provide sub-nanosecond accuracies for generating and distributing high speed waveform edges to boards of up to 256 tester pins and having the edges all arrive at the pins at precisely the same instant. However, there are still a number of inaccuracies due to multi-error sources that are inherent in the system.

One of the more critical specifications of a tester is the timing system. At present, some systems provide a 60-ps resolution, 500-ps maximum driver-to-driver and comparator-to-comparator skewing, and 700-ps maximum edge placement error. The overall timing accuracy is within ±1.5 nanoseconds. Actual testing with these inherent errors can result in increased measurement error. Design of the VLSI testers is made more difficult by the requirement of maintaining timing accuracy across all the tester pins, especially when the number of pins is increased to upwards of 256 pins.

Sources of the more complex VLSI testers require very sophisticated calibration techniques. It is necessary through calibration to ensure that all timed voltage transitions delivered to the pins of the device under test (DUT), and at all times at which data output from the device is compared with expected data, are accurate in relation to a defined reference. The degree of this accuracy can determine the overall system accuracy. Signals traveling a channel path to a DUT must pass through multiplexers, formatters, cables and drivers or detectors. Timing variations are inherent in these circuits, and the associated cable lengths from channel to channel. These voltage transitions at the input pins and data detection at the output pins occur at different times even though they are supposed to be coincident when programmed with like delays. These timing variations are called "skew". Basically, calibration determines or measures skewing in each system channel and compensates for it by means of a variable delay in each system input and output channel. Hardware, software or a combination of the two, can be used to control the compensating delay.

In hardware calibration, normal techniques involve either torque adjustments or premeasured cables. In the torque adjustment method, channel delays are measured and then hardware delays are adjusted. When premeasured cables are utilized, a measurement is first made and then a cable of an appropriate length placed in each channel path to make all delays equal. However, these manual methods are time consuming, and cannot account for errors due to environmental, electrical and time induced circuit drifts while on-line testing is in process.

An automatic calibration scheme can be implemented with the use of a switch matrix, which can be built into a device interface board, to connect each of the system input driver channels to a reference detector. Each of the driver delays is adjusted to this reference detector. Then, each channel detector is excited by the associated driver and calibrated with respect to the system strobe. This method has two problems; first, the switching matrix must be "manually" substituted and second, a quality 1 to N matrix is very bulky and expensive to build because of the difficulty in eliminating switching stubs, which upset the characteristic impedance of the cable interconnect scheme.

Another automatic calibration technique utilizes time domain reflectometry (TDR). TDR is based on transmission line theory wherein a wave traveling through a transmission line terminated by anything other than the lines characteristic impedance is reflected back through the line. If the line terminates with an open circuit, the reflected waves ambient equals that of the forward wave. A number of these circuits have been utilized by such companies as Teradyne, which provides an automatic edge lock technique utilizing TDR to measure channel delays. This approach however, provides some disadvantages in that it is rather complex and expensive, requiring a computer controlled TDR, a 1 to N switching matrix and bypass switches for the pin electronics drivers. A binary matrix of 1 to 256 would require eight levels of form C relays, each of which have a built-in stub.

SUMMARY OF THE INVENTION

The present invention disclosed and claimed herein comprises a calibration circuit for calibrating time skew between a plurality of test terminals. The calibration circuit includes a common node with cables disposed between common node and associated with one of the terminals such that each terminal has a single cable associated therewith, each of the cables identical in length and internal impedance. Driver circuitry is provided for driving the input of each of the test terminals and the input of each of the cables with a signal at a predetermined time. Receiver circuitry is provided for receiving signals from the test terminal which are comprised of the transmitted signal and reflected signals from the cable. Drivers and receivers are the same as normally used with testing. The receiver is operable to measure transmitted and reflected signals. Measurement technique is provided for measuring the delay between the transmitted and reflected signals at each of the receivers associated with each of the terminals. The measured delay is compared with an expected delay and then an error generated. The error is iteratively corrected by correcting the predetermined time for each of the driver circuitry to compensate for the error. A plurality of calibrated drivers driving a common node thereby provides a "master driver" waveform the common reflection, which waveform is used to calibrate the receiver strobes to each other.

DETAILED DESCRIPTION OF THE DRAWINGS

For a more complete understanding of the present invention and the advantages thereof, reference is now made to the following description now taken in conjunction with the accompanying Drawings in which.

DETAILED DESCRIPTION OF THE INVENTION

Figure 1:
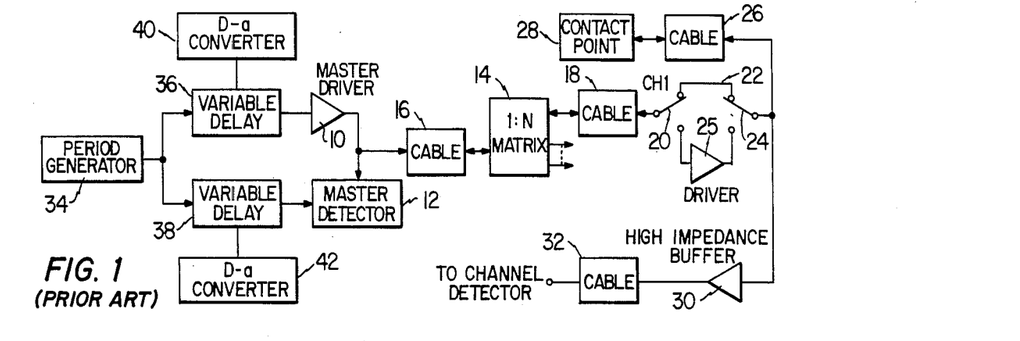
FIG. 1 illustrates a schematic block diagram of a prior art tester utilizing a switching matrix.

Referring now to FIG. 1, there is illustrated a schematic block diagram of a prior art tester utilizing a switching matrix for the auto calibration feature. The system is provided with a master driver 10 and a master detector 12 each input to a 1:N matrix 14 through a cable 16. The matrix 14 has the input thereof connected through a cable 18 to a switch 20. The switch 20 is operable to select a bypass path 22 or the input of a channel driver 25. Both the output of the bypass path 22 and the channel driver 25 are connected to a second switch 24, the output of which is conencted to the input of a cable 26. The cable 26 connects the output of switch 24 with a contact point 28. The contact point 28 is the point which is to be measured by the system of FIG. 1.

The switch 24 is also connected to the input of a high impedance buffer 30, the output of which is connected to a channel detector (not shown) through a cable 32. A period generator 34 is provided for generating the clock edge that is input to the input of a variable delay 36 and also the input of a variable delay 38. The output of variable delay 36 is input to master driver 10 and the output of variable delay 38 is input to the master detector 12. A D/A converter 40 is operable to control the variable delay 36 and a D/A convertor 42 is operable to control the variable delay 38.

The system of FIG. 1 illustrates a time domain reflectometry technique which is utilized to measure channel delays to the open circuited contact point 28. During calibration, waveform edges from the master driver 10 are sent to the contact point 30 where they are reflected back to the master detector 12. The switch 20 and the switch 24 are both configured to pass the signal through the bypass path 22. The 1:N matrix 14 connects the master driver 10 to each of the test system channels one at a time. The channel drivers are bypassed while the delays are measured.

Figures 2, 3, 4:
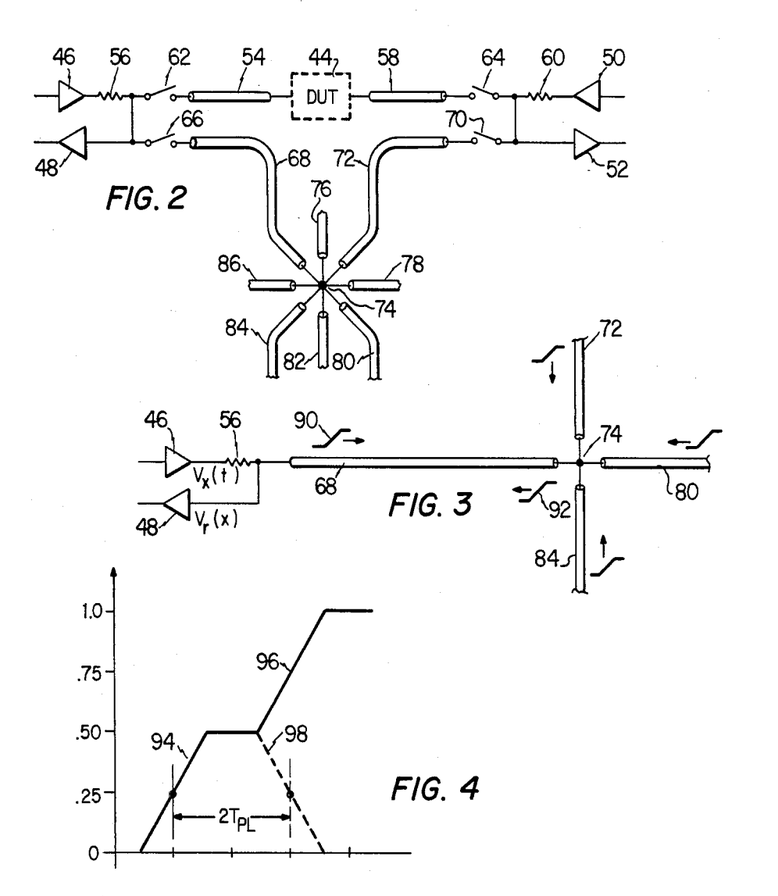
FIG. 2 illustrates a schematic block diagram of the auto calibration circuit of the present invention.
FIG. 3 illustrates a detailed diagram of one of the transmitter/receivers of FIG. 2.
FIG. 4 illustrates a waveform that depicts the signal level at a receiver for a complete reflection at the node.
Figure 7:
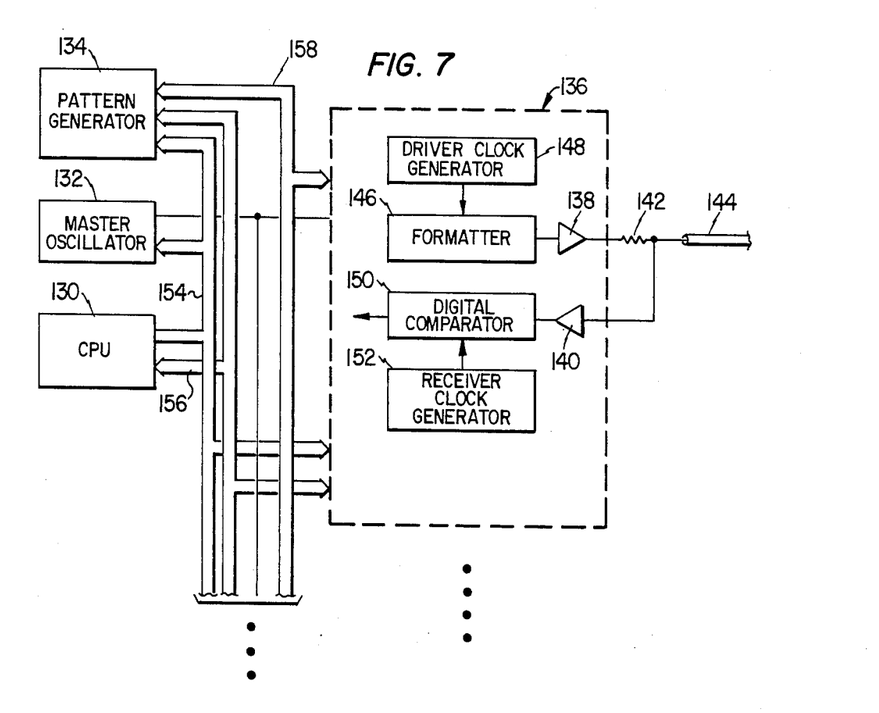
FIG. 7 illustrates a CPU that is provided to control the system, the system as is used with this invention.

Referring now to FIG. 2, there is illustrated a schematic block diagram of the auto calibration matrix of the present invention and only the tester portion from the drivers to the device under test (DUT). The remaining circuitry shown only in FIG. 7 is conventional circuitry such as formatters, master clocks, variable delays, etc., which are utilized to generate the output signals. The circuit of the present invention is concerned with providing a calibration between the actual drivers/receivers and the DUT.

Illustrated in FIG. 2 are two sets of driver/receivers for providing signals for a DUT 44 (shown in phantom outline). The first set of drivers/receivers is comprised of a driver circuit 46 and a receiver 48. the second set of drivers/receivers is comprised of a driver 50 and a receiver 52. The drivers and receivers 46-52 are conventional pin electronic drivers/receivers. The driver 46 is connected to the input of a cable 54 through a series resistor 56 and series switch 62. The driver 46 and series resistor 56 provides a termination impedance that matches the characteristic impedance of the cable 54 of, in the preferred embodiment, 50 ohms. In a similar manner, the driver 50 is input to a cable 58 through a series resistor 60 and series switch 64. The receiver 48 has the input thereof connected to the switch 62 at the junction with the resistor 56 and, in a similar manner, the receiver 52 has the input thereof connected to the point between the switch 64 and the resistor 60. The output of cable 54 is connected to a lead of the DUT 44 and, in the same manner, the output of cable 58 is connected to another lead of the DUT 44. The leads of the DUT 44 are centrally connected to the internal microcircuit, which circuit is the object to be tested and, at which point, or node, the system timing is to be calibrated.

To perform this calibration, a common node 74 will be described and utilized as follows. the junction of resistor 56, switch 62 and receiver 48, is connected to the input of a series switch 66, the other terminal of which is connected to the input of a cable 68. In a similar manner, the junction of resistor 60, switch 64 and receiver 52, is connected to one terminal of a switch 70, the other terminal of which is connected to the input of a cable 72. Cables 68 and 72 have the other ends thereof connected to a common node 74. Cable 68 and 72 are both of equal characteristic impedance and of predetermined lengths, in the preferred embodiment, of equal length. In a similar manner, every other tester driver/receiver is connected through a switch similar to switch 66 and cables similar to cable 68 for interface with common node 74. These are illustrated as cables 76, 78, 80, 82, 84 and 86. However, it should be understood that for each test pin in the system, there is an associated cable, each of the cables being of a known length, and equal in impedance to each other and to the source impedance, made up of the series impedance of, for example, driver 46 and resistor 56.

In order to maintain equipment skew witihn specifications while on line and actually testing devices, it is necessary to periodically calibrate the system to determine if changes have occurred in the system, thus resulting in a time skew between the device pins. This time skew can be the result of temperature variations, aging or any other factors which may cause various delays, etc., in the system between the DUT 44 and the timing generators (not shown). It is desirble that the time skew be calibrated at the actual pin connection to the DUT 44. However, it is quite difficult to place a calibration point at a probe tip and, therefore, there will be a slight length of cable or line between the actual driver electronics and the actual probe point. This is represented by cables 54 and 58 in FIG. 2.

In operation, the auto calibration function is performed in two steps. First, time skew is calibrated to the input of the switches 62 and 64 and at the node associated therewith. The switches 66 and 70 are closed and switches 62 and 64 are open. This allows the common node 74 and the associated cables to be connected to the pin electronics. In accordance with the procedure described hereinbelow, the auto calibration function is performed and appropriate corrections stored in the system for maintaining time skew within the predetermined specifications at the output of the drivers 46 and 50. However, it is still necessary to account for the delay between the input to switches 62 and 64 and the DUT 44. This can be accomplished in two ways. First, a table can be generated which accounts for the specific delays in each of the cable 54 and 58 associated with each of the pins in the test circuit. It should be noted that only two pins are illustrated in FIG. 2. These delays or correction factors are then accounted for to determine the appropriate time skew. Second, the actual delays can be measured by placing a calibration circuit of the type associated with the common node 74 in place of the DUT 44. This allows the calibration function to be performed on a common node in the place of the DUT 44 which represents the actual center of the DUT 44 that will be utilized with the test circuit. This accounts for the various delays or errors associated with the portion of the test circuit between the outputs of the drivers/receivers and the actual or physical center of the DUT 44. This provides in effect a virtual node. These errors are then stored and are used in determining the actual time skew from the input of switches 62 and 64 to the actual input to the DUT 44.

Referring further to FIG. 2, the operation of the calibration circuit will be described in more detail. During auto calibration, the DUT is removed from the system by opening switches 62, 64 and like switches on all remaining test pins and, node 74 is connected by way of switches 66, 70 and cables 68, 72 and like switches and cables on all remaining test pins. At this point all drivers in the test system are connected to the common node 74.

During calibration, a clock edge is transmitted through driver 46 to receiver 48 and also to common node 74 by way of switch 66 and cable 68. if only one driver is on in the system, the common node 74 will appear as a "short circuit" to the driver. Therefore, a voltage drop will appear across resistor 56 on the input of receiver 48 after a period of time equal to two time delays, each time delay being the time required for the clock edge to propagate through cable 68. This time delay is equal for all drivers in the system.

Initially, the input to receiver 48 goes high until the time that the reflected clock edge from common node 74 returns back to the input of receiver 48, at which time the input goes low. This is only the case for a system wherein all of the other drivers are off. In calibrating the present system in accordance with the present invention, all of the drivers are simultaneously excited with an edge to provide a cumulative waveform at common node 74. This cumulative or master waveform arrives at all of the receivers in the system at approximately the same time. Therefore, the receiver 48 would measure in time the initial clock edge going high that was output from driver 46 and at a later time would measure the cumulative transmissions from all of the remaining drivers in the system in addition to the reflected clock edge of driver 46. As will be described in more detail hereinbelow, by comparing the received signals with the expected signals, an error can be calculated and an adjustment made. This adjustment is made to each driver in the system by varying the time when the input clock edge occurs relative to the received signals. When all the drivers are calibrated, an identical trace will appear at the receiver at all of the driver/receiver sets associated with any of the test points. The present invention provides the advantage of a relatively simple system requiring only a length of coax and a single switch for each test point. In addition, a relatively straightforward computer algorithm can be utilized to make the calibration.

Referring now to FIG. 3, there is illustrated a more detailed diagram of one of the transmitter/receivers of FIG. 2, primarily the transmitter 46 and receiver 48, wherein like numerals refer to like parts in the various FIGURES. For simplicity purposes, only transmission lines 68, 72, 80 and 84 are illustrated connected to the node 74. In operation, all of the terminals have a clock generated and transmitted on the input thereto from a common time reference $t_0$. The output of the transmitter 46 is referred to as $V_x(t)$ at the input to resister 56. On the output of resistor 56, the received signal for receiving a relfected signal from the node 74 through coax 68 is referred to as $V_r(x)$. At time equal to zero, a clock edge is transmitted into cable 68. This is illustrated by a clock edge 90 with an arrow directed toward the node 74. At the node 74, a number of things can happen, depending upon the impedance of the junction and the other signals present thereat. The reflected signal for a short circuit will be negative going clock edge returning to receiver 48 as the voltage $V_r(x)$. However, if an open circuit is present at the node 74, the full energy will be reflected back to the input of receiver 48. The driver 46 and resistor 56 have a combined impedance of $R_0$ which is essentially equal to the characteristic impedance of cable 68. This is usually 50 ohms. Initially, the resistor 56 and cable 68 operate as a voltage divider with the voltage $V_r(x)$ equal to one-half the level of voltage $V_x(t)$. When the clock edge returns from an open circuit at node 74, the reflected signal will sum with the level of the input voltage level and rise to the full level of $V_x(t)$ at the input of receiver 48. The time for the clock edge to travel from the input of cable 68 to the junction 74 is equal to one delay time $(T_{DL})$. The time for the reflected clock edge to return from node 74 to the input of receiver 48 is equal to $T_{DL}$. Therefore, the time between incident and reflected clock edges will be equal to $2T_{DL}$.

In accordance with the present invention, the incident and reflectd signals are analyzed. The incident signal will be representative of the actual clock edge input to the respective cable associated with the terminal. However, the reflected signal will be a composite of the transmitted energy from all the remaining pins in the system and also the reflected energy from that particular pin or terminal. In the ideal case with all clock edges being applied to all the terminals at the same point in time (i.e., system calibrated), the clock edges will arrive at the node 74 at precisely the same time since the associated cables are of the same length. This will result in no current flow at the node 74, thus, providing an open circuit. All energy is reflected from the node 74 back to the input of the respective cable. The delay between the incident and reflected signals will therefore equal $2T_{DL}$. However, if one signal or clock edge is applied to a terminal at a point in time earlier than the clock edges for the remaining terminals in the system, the transmitted clock edge for that particular terminal will arrive at node 74 prior to the remaining clock edges in the system. This will result in a partial reflection from a lower impedance at the node 74 with the result that a portion of the energy from driver 46 will pass through node 74 to the other cables 72, 80 and 84 in the system. Also, transmitted power from the driver associated with the remaining cables in the system will pass through node 74 to cable 68 and comprise part of the signal $V_r(x)$. This is due to the lack of "complete" reflection at node 74 for all of the cables involved.

Referring now to FIG. 4, there is illustrated a waveform that depicts the signal level $V_r(x)$ at receiver 48 for a complete reflection at node 74. For this condition, each mark on the x axis of the coordinate system represents one time delay ($T_{DL}$). The waveform that is incident at the cable is represented by an edge 94 which, for reference purposes, has an amplitude at the output of transmitter 46 of "1.0" and has an amplitude of 0.5 after a period of time less than one delay due to the drop across resistor 56. For analysis purpose, the clock edge is measured at 0.25 of the amplitude of $V_x(t)$. For a perfectly aligned system, a virtual open circuit at node 74 will be present, thus resulting in a reflected wave, represented by clock edge 96. For the virtual open circuit condition, the reflected clock edge requires one delay time to return, thus resulting in a total delay between the initial clock edge and the reflected clock edge of $2T_{DL}$. The reflected edge results in an increase in the level of $V_r(x)$ to the level of $V_x(t)$. The clock edge 96 is measured at a level at 0.75 of the total level with this level representing 50% of the reflected wave.

For the condition where a short circuit results at node 74, the reflected clock edge 92 that is reflected from node 74 will result in an edge 98 (shown in dotted line) which goes back to a low voltage level, which is the level for a short circuit. It should be noted here that by measuring the time of 25% crossing of the incident waveform 94 and the 25% crossing of the short circuit reflected waveform 98, the delta will be $2T_{DL}$, and may be used as a measure of the length of reference cable 68. In a similar manner the length of cable 72 and all remaining cables may be determined. The short circuit waveform 98 is the path that the voltage $V_r(x)$ will traverse for any portion of the time that the node 74 appears as a short circuit. This will occur if the edge 94 occurs earlier than all the remaining clock edges in the remaining terminals in the system for the period time that the clock edge precedes the transmitted clock edges of the remaining terminals, as will be described in more detail hereinbelow.

For the purposes of generating a model, the following equation is useful.

$$V_r(x) = \tfrac{1}{2}[V_x(t) - V_x(t - 2T_{DL})] + 1/N \sum_{i=1}^{N} V_i(t - 2T_{DL})$$

Where:
$V_r(x)$ = Voltage at receiver for terminal x.
$V_x(t)$ = Voltage at driver output at time t for terminal x.
$V_i(t)$ = Transmitted voltage from remaining terminals and reflected voltage from terminal x.
N = Number of terminals For the above equation, the first term of the equation represents a shorted transmission line wherein the node 74 represents a short circuit. This condition will exist wherever the transmitted clock edge from a particular terminal arrives at node 74 prior to the transmitted clock edges of the remaining terminals. This will result in the voltage $V_r(x)$ following the path 98 in FIG. 4. However, very shortly thereafter, the second portion of the equation will cause the voltage to rise, as it represents all the transmitted power from the remaining terminals. This transmitted power will result in the voltage increasing to a level of 1.0. Of course, the delay between the 25% crossing and the 75% crossing will not equal twice the delay of the cable, but, rather, will equal a larger or smaller amount of delay. This depends upon the relationship of the transmitted clock edge on a given terminal with respect to that of the remaining terminals, as will be described hereinbelow.

Figure 5:
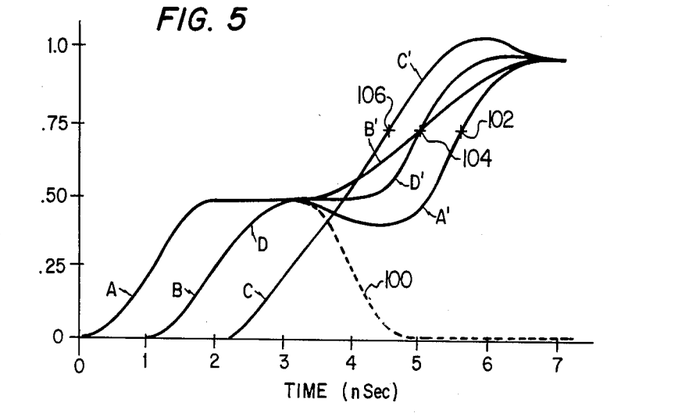
FIG. 5 illustrates a waveform depicting the input to three terminals which are skewed in time by one second.

Referring now to FIG. 5, there is illustrated three waveforms depicting the voltages at three terminals, terminal A, terminal B and terminal C, which are skewed in time by one nanosecond. The clock edge input to terminal A is one nanosecond earlier than the clock edge input to terminal B and the clock edge input to terminal C occurs one nanosecond after that input to terminal B. All three waveforms are superimposed on the same coordinate axis for simplicity purposes. In addition, a waveform D is illustrated which represents the ideal case with no skewing between the input clock edges.

The waveform at the receiver on terminal A is comprised of two portions, a first portion "A" representing the incident clock edge and a second portion "A'" representing the reflected signal. In a similar manner, the waveform at the terminal "B" is represented by a first portion "B" and a second portion "B'" and the waveform at terminal C is represented by a first portion "C" and a second portion "C'". For simplicity purposes, a waveform for the ideal condition is represented by an incident portion "D" and a reflected portion "D'". As described above, the D and D' portions represent the ideal case which should appear at all terminals when the system is calibrated.

With reference to FIG. 5 and waveforms A and A' for the A terminal, it can be seen that the incident waveform A rises to a value of 50% of the total value and has a 25% crossing at one nanosecond. For illustrative purposes, the delay one-way through the cables to the node 74 is equal to 1.5 nanoseconds. Therefore, the total round-trip delay for the incident and the reflected signal will be 3 nanoseconds. For the ideal case, the 25% and the 75% crossing should be separated by 3 nanoseconds. However, due the time skewing of the incident clock edges for the A, B and C terminals, this will not be so. In the illustrated example, it can be seen that the reflected portion A' initially decreases in value due to the fact that the incident clock edge from the A terminal has arrived at the node 74 prior to the incident clock edges for the B and C terminals. This results in a low impedance at node 74 reflected back to the A terminal. For discussion purposes, a dotted line 100 has been included to illustrate the condition where all the remaining drivers in the system are off and only the driver at the A terminal is on. It can be seen that the voltage at the A terminal will have tendency to decrease in level until incident energy is received from the remaining terminals. When this occurs, the voltage level goes upward to the full value. The 75% crossing is represented by a point 102 on the A' curve. This occurs at approximately 5.5 nanoseconds which is a delay of 4.5 nanoseconds from the 25% crossing of the A curve. This is 1.5 nanoseconds longer than the calibrated ideal situation that is represented by the D' waveform.

The incident clock edge B is at the 25% crossing at two nanoseconds and at the 75% crossing at a point 104 at approximately five nanoseconds on the B' waveform. There is no adjustment necessary for the incident clock edge since the delay between the 25% and 75% crossing points is equal to 3 nanoseconds. However, it should be noted that the portion of the B' waveform preceding the 75% crossing is slightly higher than the ideal situation represented by the D' waveform. This is due to the fact that the A waveform preceded the B waveform and energy from the A waveform will travel downward through the cable and transmitted energy will be received at the receiver on the B terminal. This increases the voltage level prior to the 75% crossing. In a similar manner, the late arrival of the C waveform transmitted energy will cause the portion of the B' waveform immediately after the 75% crossing to decrease in value.

The incident clock edge at the C terminal is delayed from the incident clock edge B by one nanosecond such that the 25% crossing occurs at 3 nanoseconds. The reflected waveform C' at the C terminal increases immediately due to the incident energy received from both the A and the B terminals. This results in a 75% crossing at a point 106 that occurs at approximately 4.5 nanoseconds, which is a 1.5 nanosecond delay from the 25% crossing of the incident clock edge C. Therefore, an adjustment must be made to the incident clock edge C such that it occurs earlier in time.

It is important to note that the incident clock edge A at the 25% crossing only precedes by one nanosecond the incident clock edge B at the 25% crossing. However, the delay between the 25% crossing of the incident clock edge A and the 75% crossing of the reflected waveform A' is 4.5 nanoseconds, which indicates an error of 1.5 nanoseconds. The actual error is one nanosecond which means that the error is "amplified." The amplification of error can increase upwards to a factor of 2 as the skew between incident clock edges decreases to a value less than the risetime of the drivers.

In the preferred embodiment, the procedure to correct skew is to divide the error in delay between the 25% crossing and the 75% crossing of the waveforms, respectively, on a given terminal and divide this by two to effect the proper correction. Therefore, the A waveform would be delayed by 0.75 nanoseconds after measurement thereof. The B waveform would then be measured and no delay would be necessary. The waveform on the C terminal would then be measured, resulting in a delay between the 25% and 75% crossings of 1.5 nanoseconds. This would require advancing the C waveform in time by 0.75 nanoseconds. The three terminals would then again be measured and then the same iterative procedure gone through; that is, the delay between the 75% and 25% crossings measured and compared with the expected delay of three nanoseconds. The measured error is then divided by two and the correction made for each terminal in the system. When the iterative procedures have been effected, the waveform should be as indicated by the incident portion D and the reflected portion D'. All input terminals will coincide with this waveform.

In actual practice, it has been observed that some sinusoidal variations occur in the incident and reflected waveforms. These sinusoidal variations normally occur as the deviation between waveforms exceeds the rise time of the waveform or the length of the reference cable. In this condition, there can be multiple 25% crossings and multiple 75% crossings. It has been determined in actual practice that it makes no difference which crossing is measured to determine the error correction that is to be made. However, it is preferred that either the first or the second crossing only be utilized in each measurement to be consistent. As each iterative procedure is performed, the multiple crossings disappear and the waveforms "home" in on the calibrated waveform.

Figure 6A:
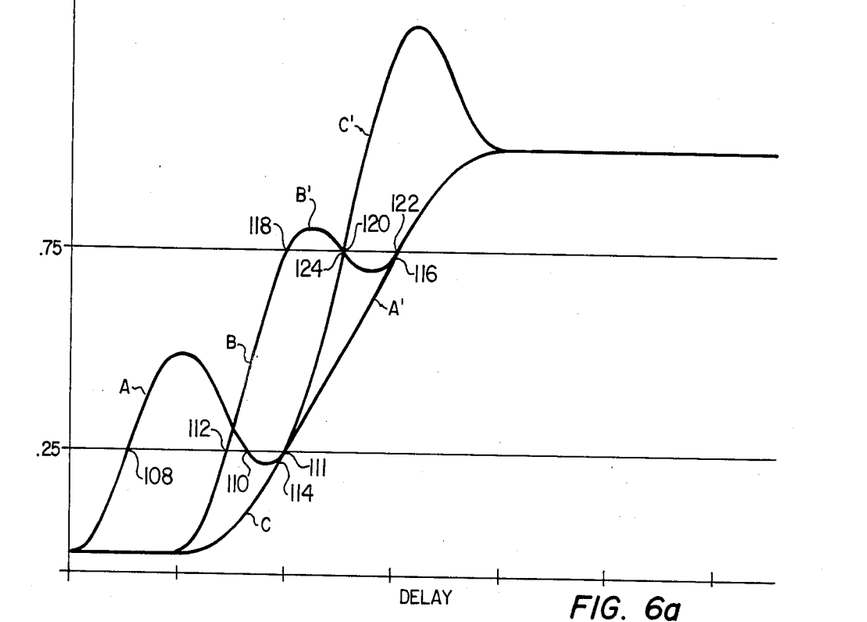
FIGS. 6a-6d, there is illustrated a sequence of iterative curves for the terminals.

Referring now to FIGS. 6a-6d there is illustrated a sequence of iterative curves for the terminals A, B and C, described above with reference to FIG. 5. However, for these curves the reference delay cable length has been reduced dramatically, such as might be the case when using cables 54, 58, and a shorted DUT to represent the calibration node. In FIG. 6a, the incident clock edge on the A terminal has a 25% crossing at a point 108 and a 25% crossing at a point 110 and also another 25% crossing at a point 111. The incident clock edge at the B terminal has a 25% crossing at a point 112 and the incident clock edge C at the C terminal has an 25% crossing at a point 114. The reflected portion A' at the A terminal has a 75% crossing at a point 116. The reflected portion B' on the B terminal has three 75% crossings at points 118, 120 and 122. The reflected portion C' at the C terminal has only one 75% crossing at a point 124. Therefore, for the incident clock edge A at the A terminal, it is necessary to select between points 108, 110 and 111, and for the reflected portion B', it is necessary to select between the 75% crossings 118, 120 and 122. As described above, the preferred method of selecting the crossing point is to select the first crossing point using a linear search algorithm. Therefore, the point 108 on the incident clock edge A and point 118 on the reflected portion B' would be selected for the appropriate crossing points. However, the algorithm actually utilized in searching FIGS. 6a-6d is a conventional binary search algorithm that determines where the 25% crossing and the 75% crossing are in a particular waveform in any one of the receiver and is the preferred embodiment of this system.

The x axis in FIGS. 6a-6d represents normalized delay between the 75% and 25% crossings. The point 108, for example, as compared to the point 116 on the A and A' portions has a normalized delay of approximately 2.5 which results in an error of 1.5. Therefore, the A portion will need to be adjusted by delaying it 0.75 times the normalized delay. In a similar manner, the waveform at the B terminal has a delta between the 25% and 75% crossings at points 112 and 118 of 0.4 resulting in an error of −0.6, thus requiring an advance in time of approximately 0.3 times the normalized delay. The waveform at the C terminal has a delay between the points 114 and 124 of approximately 0.3, thus resulting in an error of −0.7 times the normalized delay. This will require an adjustment of 0.35 times the normalized delay whereby the incident clock edges C is advanced in the time.

Figure 6B:
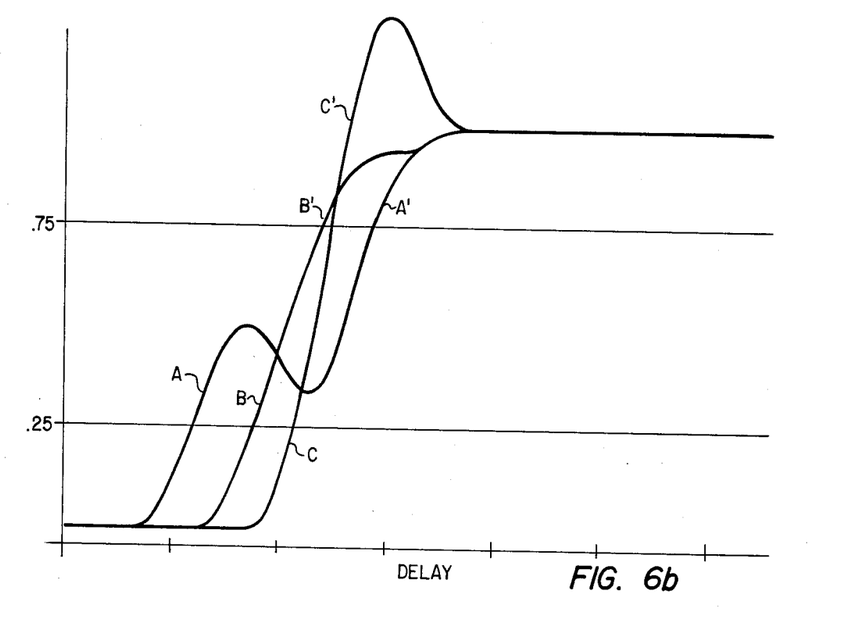
Figure 6C:
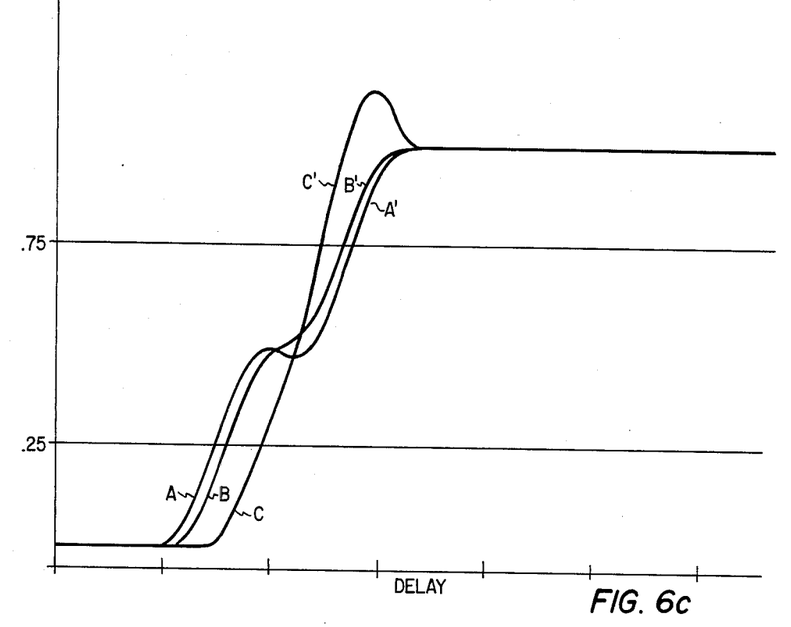
Figure 6D:
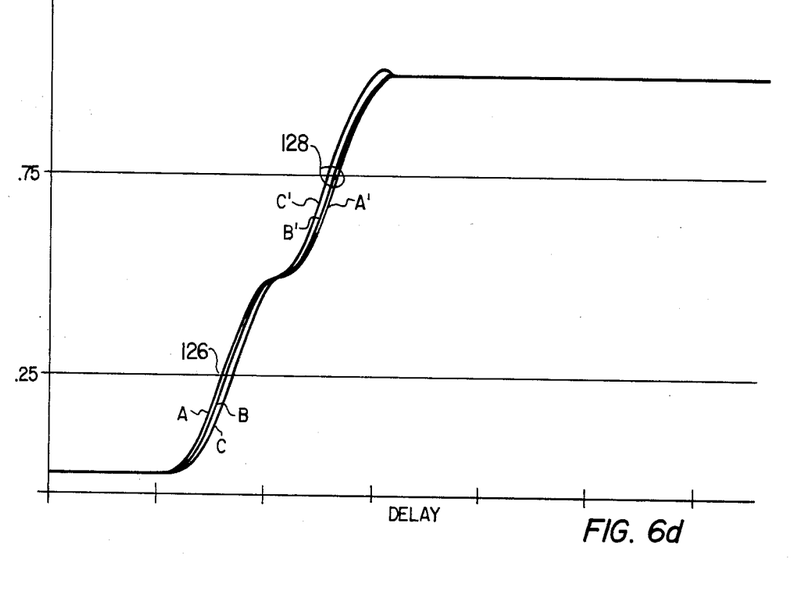

Referring now to FIG. 6b-6d, it can be seen that successive iterations are performed that result in the time skew between the clock edges on the A, B and C terminals being reduced. This can be seen in FIG. 6d where all the A, B and C waveforms have approximately the same 25% crossing at a point 126 and all the A', B' and C' waveforms have a 75% crossing at a point 128.

Referring now to FIG. 7, there is illustrated a schematic block diagram of the automatic test equipment utilized for generating the algorithm. The block diagram for the test equipment is well known in the art, as evidenced by the system illustrated in Bob Milne, "Timing, Not Speed, Counts Most When Testing Fast VLSI ICs", Electronic Design, May 29, 1986, pp. 132–142, with reference to FIG. 1 on page 134 and FIG. 1 of this disclosure. The Electronic Design article provides a multiplexing function wherein a master driver and master clock are provided for driving each pin individually. In the system of the present invention, this is altered such that a single master oscillator is provided which is controlled to drive pin circuitry associated with each of the terminals. Each of the terminals has a local driver and receiver with the local driver and receiver being driven by the local pin electronics, all being conventional parts of a logic test system.

Referring now to FIG. 7, a CPU 103 is provided to control the system, the CPU 130 being any conventional type of microprocessor based control unit having associated memory of storing. The CPU controls a master oscillator 132 to set up and determine the particular timing reference conditions for timing reference $t_0$. This is a system timing reference which is applicable to all clock edges in the system. The master oscillator provides a clock reference and this $t_0$ reference is generated in response to control signals received from the CPU 130. The master oscillator is input to a pattern generator 134, the pattern generator providing the addressing patterns of ones and zeros for a given test in the system. The pattern generator 134 and master oscillator 132 are common to all pin electronics in the system. For testing purposes, the pattern generator generates logic inputs to the DUT and expected outputs from the DUT.

The pin electronics are generally referred to in a phantom outline box 136 for one pin. It should be understood that for each pin or test terminal in the system, similar pin electronics are associated therewith. Each of the pin electronic circuits contains a driver 138 and a receiver 140, represented by the drivers and receivers 46 and 48 of FIG. 3. The driver 138 is connected through a series resistor 142 to a cable 144, the cable 144 being associated with the test terminal. It should be understood that when the cable 144 provides a connection to the DUT, it is representative of the cable 54 and cable 58, or cable 68 and cable 72, in FIG. 2, depending on which set of switches are closed, switches 62 and 64 or switches 66 and 70. The receiver 140 has the input thereof connected to the point between resistor 142 and cable 144, as described above.

The driver 138 receives an output from a formatter 146. The formatter 146 is operable to receive a pattern and convert this pattern to the proper waveform for application to the driver 138. The formatter 146 receives the pattern for storage on a cycle by cycle basis to provide the appropriate driving signal for input to the driver 138. A driver clock generator 148 provides timing for the formatter 146 and is interfaced with the master oscillator 132. The driver clock generator 148 is operable to generate the leading and trailing edges of the formatted waveform and has contained therein a programmable delay. This programmable delay receives information from an internal register to determine the delay from the reference $t_0$ of the master oscillator 132 at which the waveform edge should be generated. This is again determined by the CPU 130 on initial set up of the system.

The receiver 140 has the output thereof connected to a digital comparator 150. The digital comparator 150 also receives an input from a receiver clock generator 152. The receiver clock generator 152 operates similar to the driver clock generator 148 in that it has a programmable delay and generates leading and trailing edges of a clock referenced to the $t_0$ reference of the master oscillator 132. In operation, the digital comparator is a conventional type digital comparator that utilizes the output of the receiver clock generator for a reference to compare with the output of the receiver 140. The output of this comparator is a pass/fail type output with the digital comparator 150 set up to examine either the 25% or the 75% crossing. This is a conventional circuit.

The CPU interfaces with the main part of the associated circuitry of FIG. 7 through an address bus 154 and a data bus 156. The data bus 156 is interfaced with the pin electronics 136, the master oscillator 132 and pattern generator 134, as is the address bus 154. Therefore, the CPU 130 is operable to interface with and control all electronics in the system. The pattern generator 134 is essentially a memory which is interfaced with the CPU 130 through the data bus 156 and the address bus 154. Additionally, the pattern generator is interfaced with the pin electronics 136 through a bus 158. This allows the pattern stored or generated in pattern generator 134 to be transferred to the electronics in the pin electronics 136 at each $t_0$. Essentially, this information is combined with prestored information in the registers of the various clock generators 148 and 152 and the formatter 146 to provide a proper pattern/waveform on a cycle by cycle basis.

In operation, the system is initialized for operation by loading all the appropriate internal registers in pin electronics 136. Then it is only necessary to activate the system and determine what the output of the digital comparator 150 is for a particular pin. The CPU 130 is interfaced with the digital comparator 150 and determines whether a pass/fail condition exists. The advantage of this system is that all pin electronics are activated at the same time to apply a clock edge to the test terminals and to the node 74. It is then only necessary to sequentially measure all of the digital electronics associated with each of the test pins to determine the adjustment to be made. An adjustment is then made and a new delay stored in the driver clock generator 148 to comprise one iteration. Another measurement is made to determine if the system is within the particular skew specification and, if not, another iteration is made. This continues until this system is brought within the skew specification. Once this is done, the information can be stored by the CPU 130 and associated memory for use in performing a test.

Figure 8:
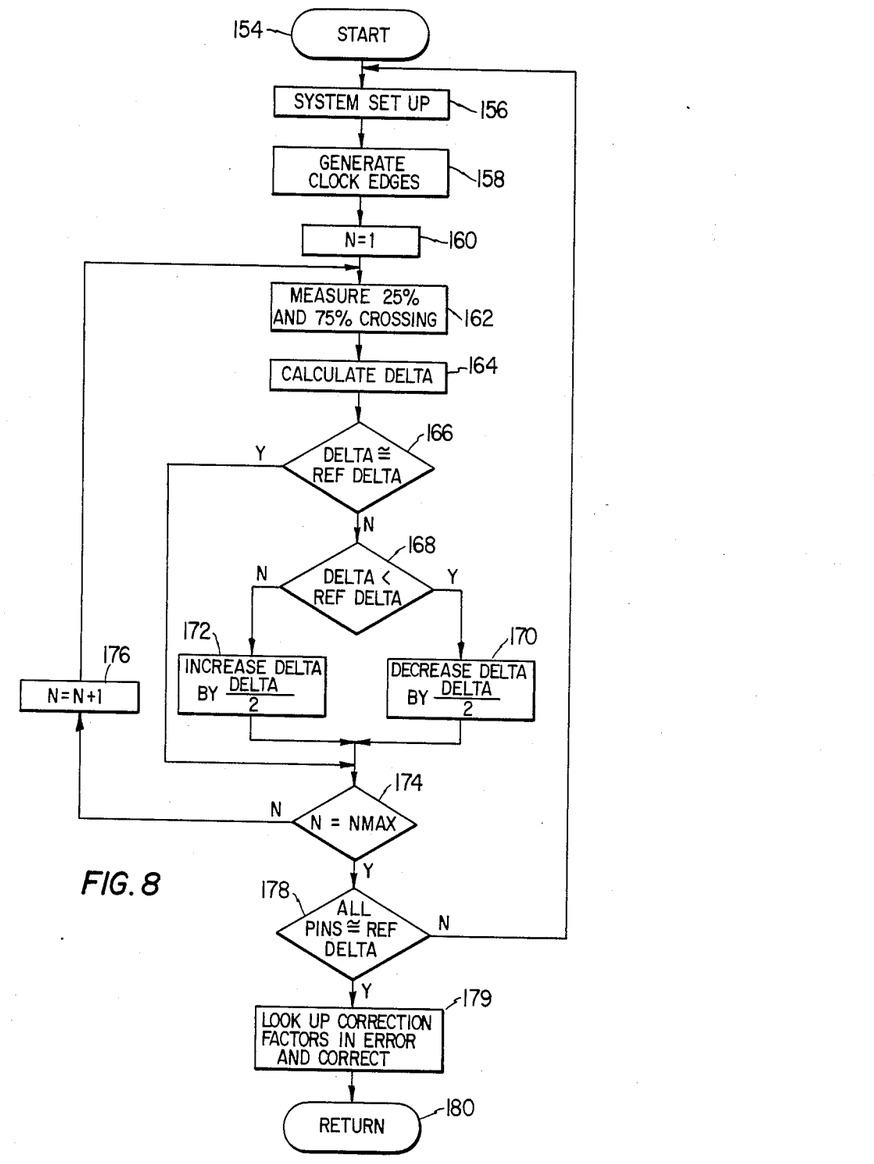
FIG. 8 illustrates a flow chart for the calibration procedure.

Referring now to FIG. 8, there is illustrated a flow chart for the calibration procedure. The flow chart is initiated at a start block 154 and proceeds to a function 156 to perform the system set up whereby all of the parameters of the system such as the initial delays are loaded into the various pin electronics, as described above with reference to FIG. 7. The clock edges are then generated, as indicated by function block 158 and a value of "N" set equal to one, as indicated by block 160. The value of N denotes the particular terminal in the system. The program then flows to function block 162 to measure the 25% and 75% crossings. The difference of "delta" value between the 25% and 75% crossings is then calculated, as indicated by function block 164 and then a determination is made as to whether this delta equals, is less than, or is greater than a corresponding reference delta. This is indicated by a series of decision blocks. The reference delta is essentially equal to the time required for a clock edge to travel through the cable in the calibration system to the common node 74 and back to the associated receiver.

The program first flows to a decision block 166 to determine if the delta is equal to the referenced delta. If so, the program flows along a "Y" path, and if not, the program flows along an "N" path to a decision block 168. The decision block determines whether the delta is less than the referenced data. If so, the program flows along a "Y" path to a function block 170 to driver clock edge by the value of the difference between the measured and reference delta divided by two. If the measured delta is greater than the reference delta the program flows along an "N" path to a function block 172 and the delay in that particular pin is increased by the difference delta divided by the factor of two. The program flows from function blocks 170 and 172 to a function block 174 to determine if the value of N is equal to the maximum value of NMAX. If not, the program flows along an N path to a function block 176 to increment the value of N by one and then back to the input of function block 162 to measure and correct another pin in the system. After all pins have been corrected, the program flows to a decision block 178 to determine if all pins approximately equal the reference delta. If not, the program flows back to the input of the function block 156 to again set the system up with the new delays to constitute another iteration. If all pins equal the reference delta, the program flows along the "Y" path to a function block 179. Decision block 178 essentially determines that all terminals are within the particular constraints for the system skew.

At function block 179, exchange errors in lengths of the calibration matrix cables to the common node 74 with previously stored errors associated with the cables to the DUT, the net result being a table of driver and receiver correction factors. This allows the time skew for the distance between the input to the calibration matrix and the actual input to the DUT to be corrected. The program then flows to a return block 180.

In summary, there has been provided a calibration system which utilizes a plurality of known length cables, one cable associated with each of the terminals in a test system. The cables have one end thereof connected to the terminal and the other end connected to a common node. All terminals are activated by a clock edge at a given time and the transmitted and reflected clock edges measured at the input to the terminal. By measuring the time differences between the incident wave and the reflected wave, a determination can be made as to whether all of the transmitted waves have arrived at the common node at the same time. If not, the delay between the incident and the reflected waveforms will vary. The ideal condition is when the delay equals twice the delay of the length of cable between the terminal and the common node. Since the cable delay is a known quantity, each of the pins can be sequentially measured and the clock edge delayed by an amount determined by taking the difference between the measured delay and the expected delay. Each pin is sequentially measured and the delays adjusted to constitute one iteration. The procedure is then repeated until the delay between the incident and the reflected clock edges on each pin is equal to the expected delay.

Although the preferred embodiment has been described in detail, it should be understood that various changes, substitutions and alterations can be made therein without departing from the spirit and scope of the invention as defined by the appended claims.

What is claimed is:

1. A calibration circuit for calibrating time skew during a calibration operation between a plurality of test terminals in a test circuit, comprising:

a common node;

delay means associated with each of the test terminals for providing a predetermined amount of delay, each of said delay means connected between the associated one of the test terminals and said common node;

a plurality of driver means each associated with a separate one of the test terminals, each of said driver means for driving the associated test terminal with a predetermined driving signal at an associated predetermined time relative to a master reference time signal;

receiver means associated with each of the test terminals for receiving signals from the associated one of the test terminals to measure transmitted and reflected signals at the associated one of the test terminals;

means for measuring the delay between the transmitted and the reflected signals at each of the test terminals;

means for comparing said measured delay as determined by said means for measuring for each of the test terminals with a predetermined expected delay for the associated one of the test terminals, said expected delay being the delay of said delay means associated with the test terminal, and generating an error value that represents the difference between said expected delay and said measured delay for the associated test terminal; and control means for generating said master reference time signal and activating all of said driver means to generate the predetermined driving signals at their associated predetermined times relative to said master reference time signal;

said control means operable to correct said predetermined time associated with at least one of said driver means in accordance with a predetermined correction algorithm to provide an error correction value;

said control means operable to continuously regenerate said master reference time signal and activate all of said driver means while sequentially correcting others of said predetermined times associated with each of said driver means in accordance with said predetermined correction algorithm until said error value is less than a predetermined error value;

said control means storing said error correction values for each of said driver means after correction of said associated predetermined time.

2. The calibration circuit of claim 1 and further comprising switch means disposed between each of the test terminals and the associated one of said delay means for selectively isolating said delay means from the associated one of the test terminals during a test operation and for interfacing said associated delay means with the associated test terminal during the calibration operation.

3. The calibration circuit of claim 1 wherein each of said delay means comprises a cable of a predetermined length and a predetermined characteristic impedance, each of said cables that is associated with each of the test terminals having a known length and the same characteristic impedance and further comprising a resistor disposed between the associated test terminal and said cable, said receiver means connected to a point between said resistor and said cable.

4. The calibration circuit of claim 3 wherein each of said cables of said known length have an equal length.

5. The calibration circuit of claim 1 and further comprising:
   first switch means associated with each of the test terminals and disposed remote from the associated test terminal and having an open position and a closed position;
   cable means disposed between said first switch means and the associated test terminal, said first switch means operable to connect said driver means and said receiver means to said cable means;
   second switch means associated with each of the test terminals and disposed on the side of said first switch means proximate said associated driver means and said associated receiver means; and
   said second switch means for selectively isolating said delay means from the associated test terminal during a test operation and for interfacing said associated delay means with the associated test terminal during the calibration operation.

6. The calibration circuit of claim 5 and further comprising means for determining the time skew associated with said cable means and associated with said means for iteratively correcting to provide a correction factor for said cable means.

7. The calibration circuit of claim 1 wherein said driving signal comprises a clock edge representing a change in logic state from a first binary logic state to a second binary logic state.

8. The calibration circuit of claim 7 wherein said means for measuring delay comprises means for determining the receipt of a predetermined voltage level of said transmitted signal and for determining the receipt of a predetermined level of said reflected signal to each of the test terminals and calculating the duration of time therebetween.

9. The calibration circuit of claim 7 wherein said second logic state has a predetermined input voltage level and said means for measuring delay comprises means for determining when the voltage level on the associated test terminal exceeds a first predetermined level representative of said transmitted signal and a second predetermined level representative of said reflected signal with respect to time and measuring the difference in time between the occurrence of said first and second predetermined levels.

10. A calibration circuit for use with a multiple test terminal test circuit for providing a virtual calibration node, the calibration circuit comprising:
    a common node;
    a plurality of delay means each associated with one of the test terminals in the test circuit and each for providing a predetermined amount of delay;
    interface means associated with each of the test terminals for interfacing each of said delay means with the associated one of the test terminals during a calibration procedure;
    each of said delay means connected between each of the associated ones of said interface means and said common node; and
    means for controlling said interface means such that said calibration circuit is not interfaced with the test terminals when the test circuit is not in the calibration node.

11. The calibration circuit of claim 10 wherein said interface means comprises switch means disposed between the associated test terminals and the associated one of said delay means for selectively isolating said delay means from the associated test terminals during a test operation when the test circuit is not in the calibration mode, said switch means interfacing said associated delay means with the associated test terminals during the calibration operation.

12. The calibration circuit of claim 10 wherein each of said delay means comprises a cable of a predetermined length and a predetermined characteristic impedance, each of said cables associated with one of the test terminals having a known length and the same characteristic impedance.

13. The calibration circuit of claim 12 wherein each of said cables of known length have an equal length.

14. A method for calibrating time skew for a plurality of test terminals in a test circuit, comprising:
    driving each of the test terminals with a separate driving signal at a separate predetermined time in response to generation of a master reference time signal, the separate predetermined time being delayed from the master reference time signal by a separate correcting delay;
    interfacing the driving signal from each of the test terminals with a common node;
    delaying the interfaced test signal between each of the test terminals and the common node with a predetermined delay;
    receiving at each of the test terminals the transmitted driving signal and reflected signals;
    measuring at each of the test terminals the delay between the received transmitted driving signal and the received reflected signals;
    comparing measured delay at each of the test terminals with a predetermined expected delay for the associated test terminal, the expected delay being the delay between the associated test terminal and the common node, and generating an error value that represents the difference between the expected delay and the measured delay for the associated test terminal; and
    generating the master reference time signal and activating all of said driver means to generate the separate driving signals at their associated predetermined times relative to the master reference time signal;
    correcting the correcting delay associated with at least one of the test terminals in accordance with a predetermined correction algorithm to provide error correction value;
    continuously regenerating the master reference time signal to drive all of the test terminals with their associated driving signals while sequentially correcting others of the correcting delays associated with each of said the test terminals in accordance with the predetermined correction algorithm until the error value is less than a predetermined error value;
    storing the error correction values for each of the test terminals after correction of associated the correcting delays.

15. The method of claim 14 and further comprising isolating the common node from the test terminal during a test operation and selectively interfacing the test terminal with the comon node during a calibration operation.

16. The method of claim 14 wherein the step of delaying comprises disposing a cable of a predetermined length between each of the test terminals and the common node, each of the cables having a known length and the same characteristic impedance.

17. The method of claim 16 and further comprising disposing a resistor between each of the test terminals and the associated one of the cables, the step of receiving the transmitted and reflected signals at associated one of the test terminals comprising receiving the transmitted and reflected signals from a point between the associated resistor and the associated cable.

18. The method of claim 16 wherein each of the cables have an equal length to provide an equal amount of delay.

* * * * *